United States Patent [19]
Erimli et al.

[11] Patent Number: 6,029,197
[45] Date of Patent: Feb. 22, 2000

[54] MANAGEMENT INFORMATION BASE (MIB) REPORT INTERFACE FOR ABBREVIATED MIB DATA

[75] Inventors: Bahadir Erimli, Mountain View; Ian Lam, Daly City, both of Calif.

[73] Assignee: Advanced Micro Devices, Inc., Sunnyvale, Calif.

[21] Appl. No.: 08/992,920

[22] Filed: Dec. 18, 1997

Related U.S. Application Data

[60] Provisional application No. 60/038,025, Feb. 14, 1997.

[51] Int. Cl.[7] ................................................. G06F 13/00
[52] U.S. Cl. ........................... 709/223; 709/224; 370/402
[58] Field of Search ................................... 370/402, 432, 370/471, 472, 475, 400; 709/223, 224

[56] References Cited

U.S. PATENT DOCUMENTS

| | | | |
|---|---|---|---|
| 5,515,376 | 5/1996 | Murthy | 370/402 |
| 5,673,265 | 9/1997 | Gupta | 370/432 |
| 5,720,032 | 2/1998 | Picazo | 709/250 |
| 5,724,353 | 3/1998 | Sugawara | 370/395 |
| 5,781,549 | 7/1998 | Dai | 370/398 |
| 5,790,546 | 8/1998 | Dobbins | 370/400 |

FOREIGN PATENT DOCUMENTS

WO 95/22216   8/1995   WIPO .

OTHER PUBLICATIONS

Wright, M.: "Network–switch ICs simplify design and slash per–port costs", vol. 40, No. 24, Nov. 23, 1995, pp. 53–56, 58, 60, XP000546015.

Owen, S.A.: "NBBS network management", IBM Systems Journal, vol. 34, No. 4, Sep. 21, 1995, pp. 725–749, XP000542409.

"Architecture for Stackable Hub Management", IBM Technical Disclosure Bulletin, vol. 39, No. 2, Feb. 1, 1996, pp. 3–9, XP000559801.

Saunders, S.: "LAN Switch Pulls Double Duty: Kalpana's Prostack Ethernet LAN switch checks errors while working in cut–through mode", Data Communications, vol. 24, No. 5, Apr. 1, 1995, pp. 37–38, XP000501578.

*Primary Examiner*—Zarni Maung
*Assistant Examiner*—Khanh Quang Dinh

[57] ABSTRACT

An integrated multiport switch (IMS) in which an on-chip management information base (MIB) accumulation processor enables monitoring of a significantly larger number of MIB objects to be stored in external memory while minimizing, media access controller (MAC) complexity. A MAC for each port in the IMS outputs a MIB report for each transmission or reception of data according to a specific compressed format to a MIB engine that can be centrally located on the chip. The compression of the data that represents the monitored events enables conservation of the capacity of MAC buffer elements. The MIB report is immediately dispatched to the MIB engine upon receipt or transmission of a data frame. The MIB engine decodes the MIB report into a plurality of associated MIB objects. which are temporarily accumulated until the external memory is updated. The MIB engine initiates the stored MIB value updating process by retrieving the values from the external memory and adding the accumulated MIB objects to the retrieved values. The updated MIB objects are then transmitted back to the external memory for storage therein and the MIB engyine object values are reset.

11 Claims, 6 Drawing Sheets

| | | |
|---|---|---|
| RcvActivity | RcvOctets | |
| XmtActivity | RcvGoodOctets | |
| XmtOctets | ReceiveOver-SzePkts | RcvMissPkts |
| XmtExsessiveCollisions | XmtUnderRunPkts | Pkts1024to1518Octets | Pkts511to1023Octets |
| | PAUSEMACCtrl FrameTransmit | PAUSEMACCtrl FrameReceive | FrminDisc |
| RcvUnderSisePkts | RcvMultiCastPkts | RcvBroadcastPkts |
| RcvFragments | RcvAlignmentError | RcvUniCastPkts |
| Pkts64Octets | Pkts128to255Octets | Pkt256to511Octets |
| Pkts65t0127octets | XmtPackets | RcvFCSErrors |
| XmtCollisions | XmtMultiCastPkts | XmtBroadCastPkts |
| RcvExcessSzeDis | RcvJabbers | XmtOneCollision | XmtUniCastPkts |
| | XmtLateCollision | XmtDeferredTransmit | XmtMultipleCollisions |

Ports: PORT 1, PORT 2, ... PORT N, ... PORT 26

Fig. 4

MANAGEMENT INFORMATION BASE (MIB) REPORT INTERFACE FOR ABBREVIATED MIB DATA

CROSS-REFERENCE TO RELATED APPLICATION

This application claims priority from provisional patent application Ser. No. 60/038,025, filed Feb. 14, 1997, the entire disclosure of which is hereby incorporated by reference herein.

Some of the subject matter disclosed in this application is similar to subject matter disclosed in copending application Ser. No. 08/992,919, entitled MANAGEMENT INFORMATION BASE (MIB) ACCUMULATION PROCESSOR, filed Dec. 18, 1997.

TECHNICAL FIELD

The present invention relates to network switching and, more particularly, to the accumulation of Management Information Base objects (MIBs) on a data network switch logic chip.

BACKGROUND ART

A data network switch permits data communication among a plurality of media stations in a local area network. Data frames, or packets, are transferred between stations by means of data network switch media access control (MAC). The network switch passes data frames received from a transmitting station to a destination station based on the header information in the received data frame.

Packet transmission events typically are tracked to provide a basis for statistical analysis of network operation with respect to each data network switch port. For example, the number of transmitted packets, received packets, transmission collisions and the like can be counted and polled periodically. These significant parameters, termed objects, may be collected for purposes of statistical analysis. Through the use of statistical counters, determination can be made of improper device operation such as, for example, loss of packets.

Typically, each MAC unit may include a receive state machine and a transmit state machine having internal counters of limited capacity for counting a small number of transmission event parameters for each frame that traverses the respective switch port. Flip-flops, dedicated to the particular parameter objects, are respectively incremented each time an item in that frame is identified. For each incoming frame, which may be temporarily stored in a receive FIFO buffer, the respective flip-flops in the receive state machine are read and the resulting data appended to the frame. For outgoing frames, similar processing takes place. This data was traditionally stored on the chip in history or status registers.

As data networks become more robust and data traffic increases, additional operational parameters become significant. The need to track all significant parameters imposes difficulties relating to increased MAC complexity. Such complexity involves the provision of more registers and supporting logic elements, as well as a requirement for larger buffer capacities. Integration of these additional elements for each MAC on the switch logic chip places a burden on chip architecture. These projected difficulties, and the relatively limited reporting functionality for the prior art arrangement, are significant disadvantages. These disadvantages are magnified if the data representing the operational parameters are retained in uncompressed format.

Some more recent network switch versions provide a RAM based memory on the switch logic chip as a full counter for data received from all of the MACs on the chip. Incorporation of a large capacity RAM in the chip to accommodate operational parameter data from all ports incurs undesirable expense. As the number of parameters increases to keep up with expanding statistical requirements, available RAM capacity must meet these needs. Polling of the RAM for external statistical diagnostic functions would require transfer of significantly increased quantities of data. Space constraints inherent in the integration of the various elements on a single logic chip impose additional drawbacks.

DISCLOSURE OF THE INVENTION

In view of the limitations described above, the need exists for effectively satisfying the expanding requirements for provision of switch performance data by a network switch. Such requirements stem not only from the large number of ports and usage that can be expected from future implementations, but from the greater number of network operational parameters that will be monitored.

An arrangement is needed that can supply this required data while performing in an efficient manner from the standpoint of accuracy, speed and expense. Such an arrangement should be able to perform real time functions on the data network switch chip without occupying an inordinate amount of chip architecture.

The present invention addresses the above noted needs by defining significant event parameters as objects of a Management Information Base (MIB). An improved data network switch architecture includes an on-chip "MIB engine" having a MIB report processor that enables monitoring of a large number of MIB objects by each on-chip MAC, ultimately to be stored in external memory, while minimizing MAC complexity.

In accordance with the invention, an Integrated Multiport Switch (IMS) includes a large number of logic components on a single chip. A MAC for each port in the switch outputs a MIB report for each transmission or reception of data according to a specific compressed format to a MIB engine that can be centrally located on the chip. Compression of the data that represents the monitored events enables conservation of the capacity of MAC buffer elements. The MIB report is immediately dispatched to the MIB engine upon receipt of a data frame, thereby enabling efficient use of the receive FIFO buffer.

The MIB engine of the present invention includes a MIB report processor that decodes the MIB report into a plurality of associated MIB objects. which are temporarily accumulated at storage in the MIB engine until the external memory is updated. MIB report data received from the MAC for each port is allocated to a respective portion of the accumulation storage. Each such portion is sectioned into variable length segments, which correspond to predefined MIB objects.

The MIB engine initiates an external memory MIB value updating process by retrieving the values belonging to one port of the external memory and adding the accumulated MIB objects to the retrieved values. The updated MIB objects are then transmitted back to the external memory for storage therein and the MIB engine object values are reset. This process is repeated for each individual port.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein:

FIG. 4 is an example of data structure for the on-chip RAM storage in the MIB engine of FIG. 3 in accordance with the present invention.

BEST MODE FOR CARRYING OUT THE INVENTION

Figure 1:
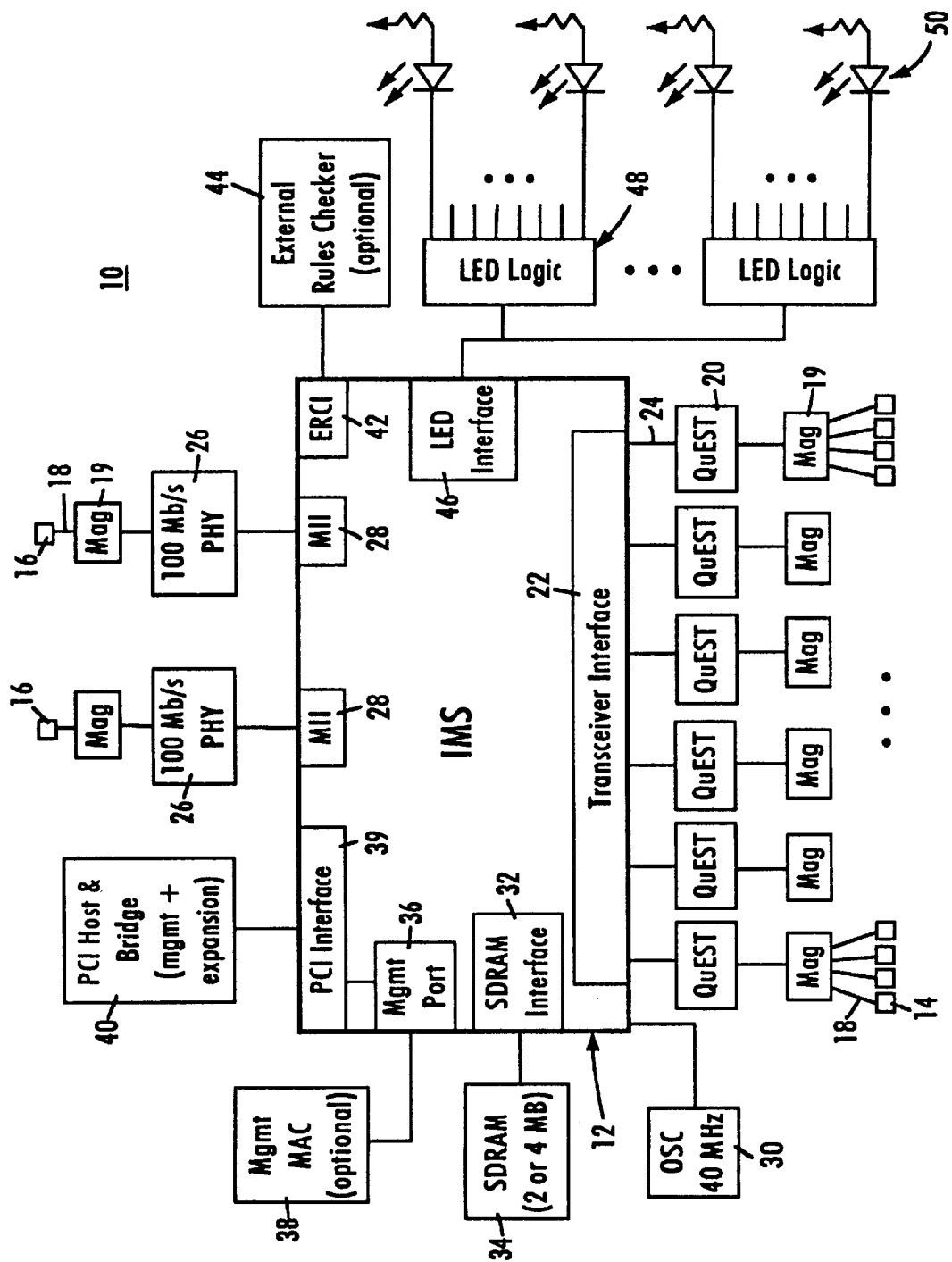
FIG. 1 is a block diagram of a packet switched system in accordance with an embodiment of the present invention.

The present invention is exemplified herein in a packet switched network environment, such as an Ethernet (IEEE 802.3) network. From the following detailed description it should be apparent that the present invention, illustrated as system 10 in the block diagram of FIG. 1, is also applicable to other packet switched systems. The packet switched network includes an integrated multiport switch (IMS) 12 that enables communication of data packets between network stations. The network stations may have different configurations. In the current example. twenty-four (24) 10 megabit per second (Mb/s) network stations 14 send and receive data at a network data rate of 10 Mb/s, and two 100 Mb/s network stations 16 send and receive data packets at a network speed of 100 Mb/s. The multiport switch 12 selectively forwards data packets received from the network stations 14 or 16 to the appropriate destination, based upon Ethernet protocol.

The 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, so that the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol.

As shown in FIG. 1, the network 10 includes a series of switch transceivers 20, labelled QuEST, that perform time division multiplexing and time division demultiplexinig for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. In the disclosed exemplified embodiment, each switch transceiver 20 has four independent 10 Mb/s twisted-pair ports and uses 4:1 multiplexing across the serial NRZ interface enabling a four-fold reduction in the number of pins required by the multiport switch 12.

The multiport switch 12 contains a decision making engine, switching engine, buffer memory interfaces configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, as described below. The multiport switch 12 also includes interfaces to enable external storage of packet data and switching logic in order to minimize the chip size of the multiport switch 12. For examples the multiport switch 12 includes a synchronous dynamic RAM (SDRAM) interface 32 that provides access to an external memory 34 for storage of received frame data, memory structures. and MIB counter information. The memory 34 may be an 80, 100 or 120 MHz synchronous DRAM having a memory size of 2 or 4 Mbytes.

The multiport switch 12 also includes a management port 36 that enables an external management entity to control overall operations of the multiport switch 12 by a management MAC interface 38. The multiport switch 12 also includes a PCI interface 39 enabling access by the management entity via a PCI host and bridge 40. Alternatively, the PCI host and bridge 40 may serve as an expansion bus for a plurality of IMS devices.

The multiport switch 12 includes an internal decision making engine that selectively transmits data packets received from one source to at least one destination station. In lieu of the internal decision making engine, an external rules checker may be utilized. External rules checker interface (ERCI) 42 allows use of an external rules checker 44 to make frame forwarding decisions in substitution for the internal decision making engine. Hence, frame forwarding decisions can be made either by the internal rules checker or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input for the system functions of the multiport switch 12. These IMS ports are also capable of operating on full-duplex.

Figure 2:
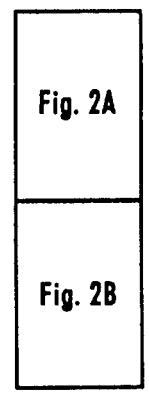
FIG. 2 is a block diagram of a multiport switch used in the packet switched system of FIG. 1.
Figure 2A:
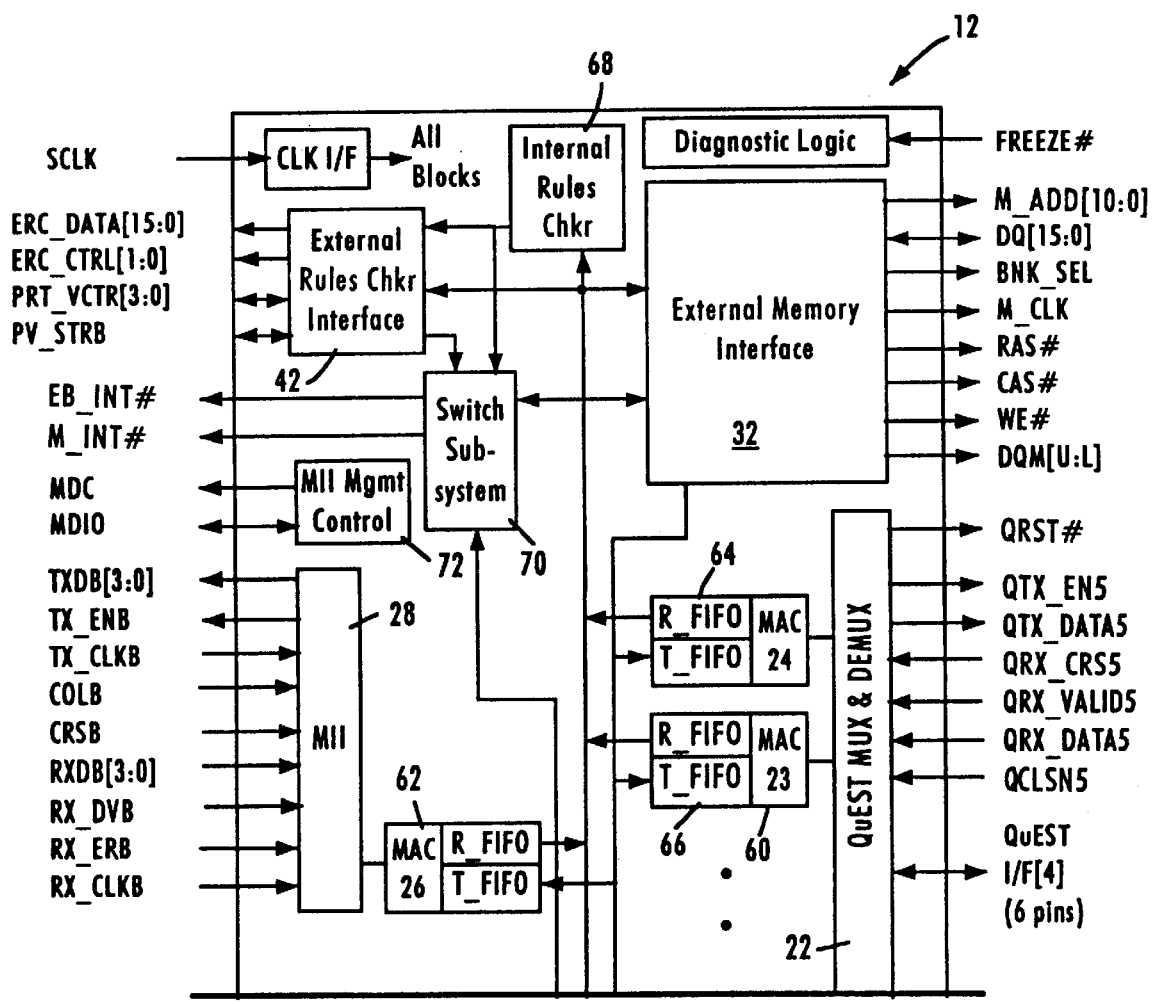
Figure 2B:
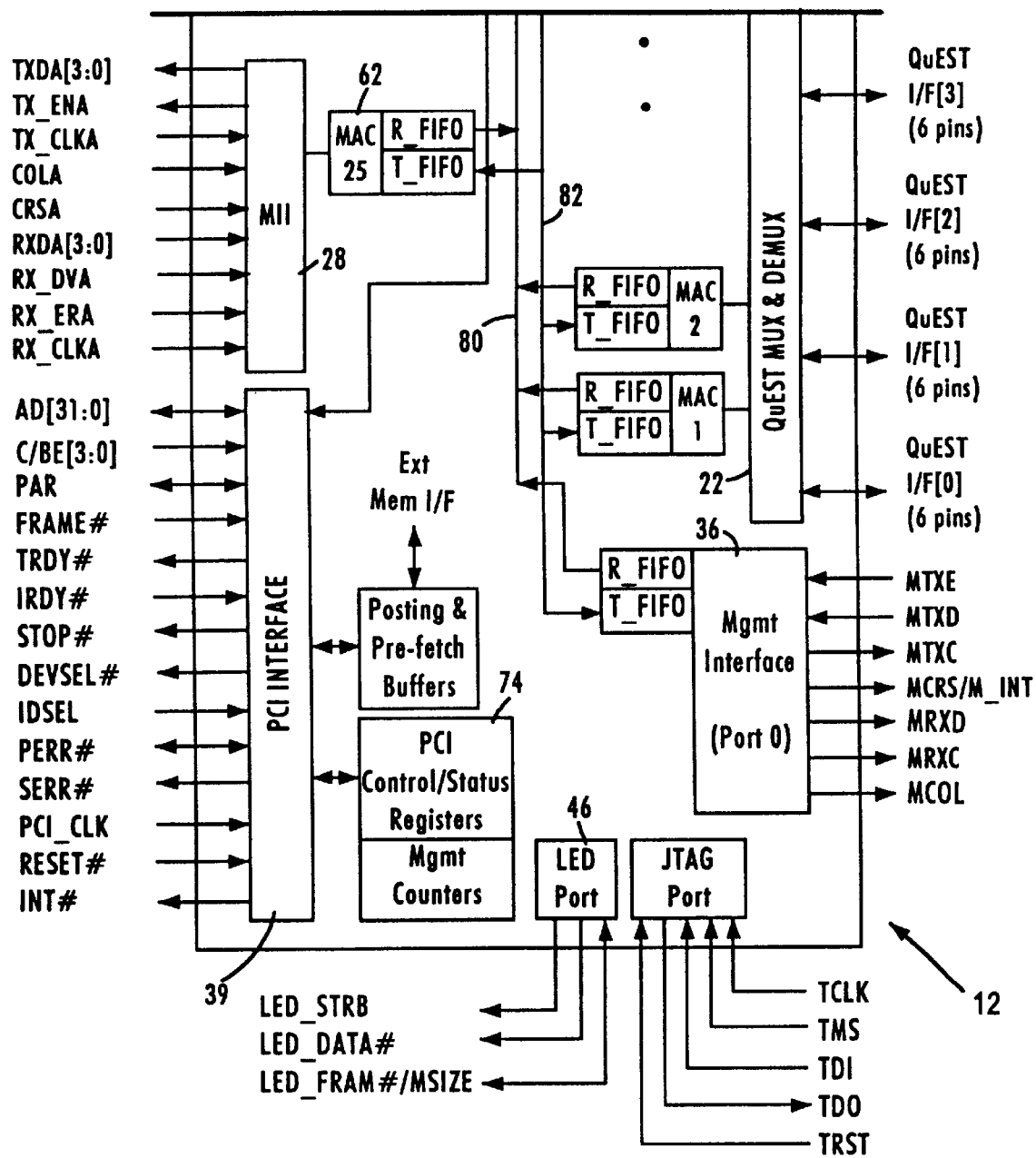

FIG. 2 is a more detailed block diagram example of the multiport switch 12 shown in FIG. 1. The multiport switch 12 includes twenty-four (24) 10 Mb/s media access control (MAC) ports 60 for sending and recieving data packets in full-duplex/half-duplex between the respective 10 Mb/s network stations 14 (ports 1–24), and two 100 Mb/s MAC ports 62 for sending and receiving data packets in full-duplex half-duplex between the respective 100 Mb/s network stations 16 (ports 25,26). As described above, the management interface 36 also operates according to MAC layer protocol (port 0). Each of the MAC ports 60, 62 and 36 has a receive first-in-tfirst-out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 or an external rules checker interface 32, to determine which MAC ports will output the data packet. Whether the packet header is forwarded to internal rules checker 68 or external rules checker interface 42 is dependent on the operational configuration of multiport switch 12. Use of the external rules checker 44 provides advantages such as increased capacity, a random-based ordering in the decision queue, and enables decisions to be made in an order independent from the order in which the frames were received by the multiport switch 12. The external rules checker also permits decisions to be made on a larger amount of data, for example, up to 64 bytes of packet information.

The internal rules checker 68 and external rules checker 44 provide the decision making logic for determining the destination MAC port for a given data packet. The decision making may indicate that a given data packet is to be output to either a single port, multiple ports, all ports (i.e., broadcast or no ports). Each data packet includes a header having source and destination address, in accordance with which the decision making engine can identify the appropriate output MAC port(s). The destination address may correspond to a virtual address, in which case the decision making engine identifies output ports for a plurality of network stations. Alternatively, a received data packet may include a VLAN (virtual LAN) tagged frame according to IEEE 802.1d protocol that specifies another network (via a router at one of the 100 Mb/s stations 16) or a prescribed group of stations. Hence, the internal rules checker 68 or the external rules checker 44 via the interface 42 will decide whether a frame temporarily stored in the buffer memory 34 should be output to a single MAC port or multiple MAC ports.

The decision making engine outputs a forwarding decision to a switch subsystem 70 in the form of a port vector identifying each MAC port that should receive the data packet. The port vector from the appropriate rules checker includes the address location storing, the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information, as exemplified by the following elements. A management data interface 72 enables the multiport switch 12 to exchange control and status information with the switch transceivers 20 and the 100 Mb/s physical devices 26 according to the MII management specification (IEEE 802.3u). The management data interface 72 also outputs a management data clock (MDC) providing a timing reference on the bidirectional management data IO (MDIO) signal path. The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
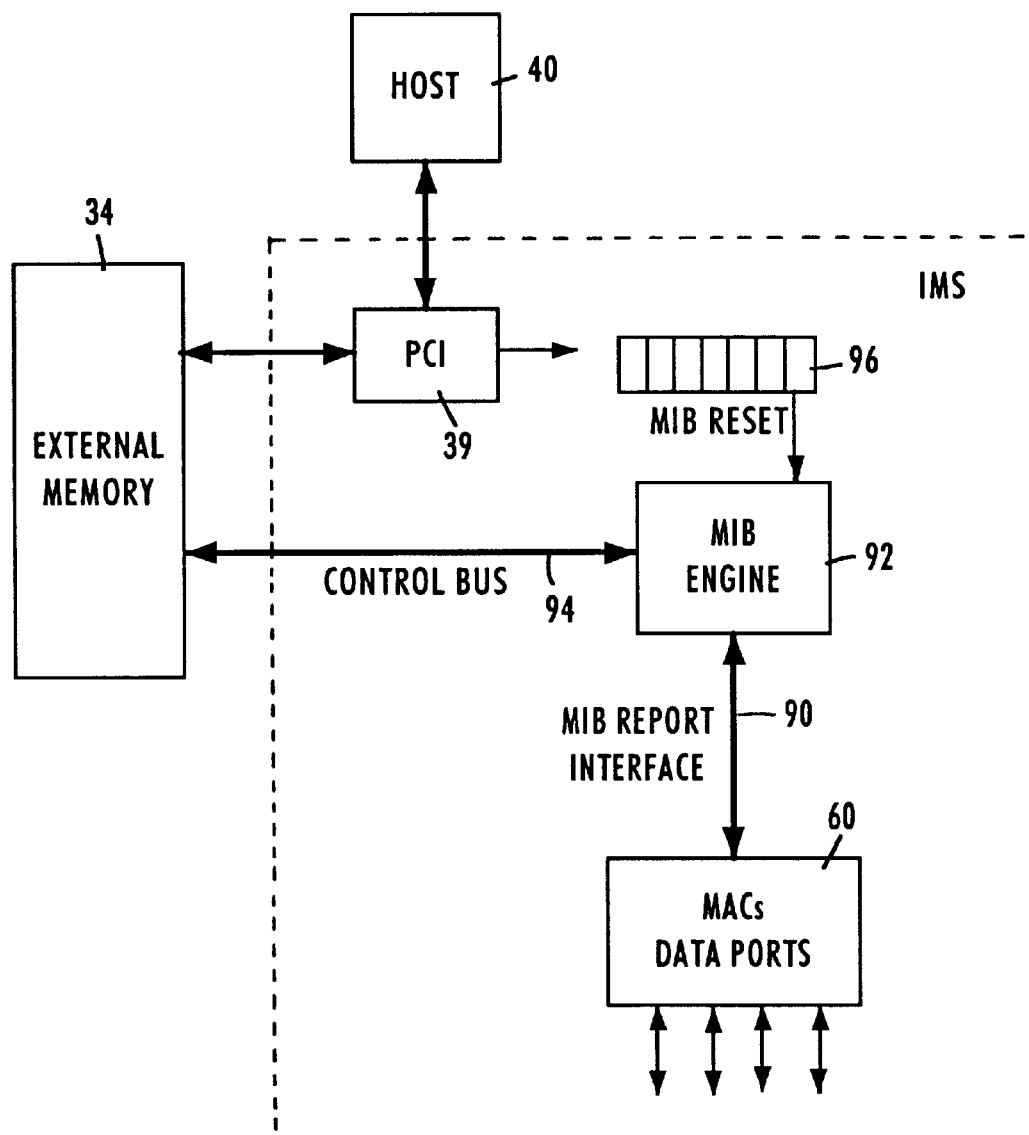
FIG. 3 is a partial block diagram relating to the processing and storage of MIB information.

The processing and storage of MIB information is illustrated by the partial block diagram of FIG. 3. The dotted line boundary delineates a portion of the IMS logic chip. Each of MACs 60, collectively illustrated as a single block, generates a MIB report that details the transmission activity at its port for each transmitted or received data frame. Each MIB report is formulated according to a compression scheme whereby the report packet is allocated specific bit groupings, or fields, that correspond to particular MIB information.

The report is sent from the MAC through a MIB report interface 90 to MIB engine 92. For the embodiment illustrated in FIGS. 1 and 2, the IMS may have 34 MIBs per each 10 Mb/s port including the Management port, 36 MIBs per each 100 Mb/s port and one MIB for the whole chip. The MIB engine will accumulate the received data in its own temporary RAM storage, associate the data with respective MIBs, and update MIB information in the external memory 34. The counters preferably are grouped in memory by port. IMS MIB counters are mapped into the external memory 34 and are accessible to the PCI Host processor 40. Only the lower n bits of all port MIBs are maintained on-chip while the full versions are in the external memory, thereby conserving on-chip RAM space. The full-length MIBs in the external memory are periodically transferred to the chip via control bus 94 and are updated before they are written back to the external memory via the control bus.

The full-length MIB counters kept in the external memory can be accessed at any time, either by the external host or by the on-chip MIB engine for updating. Periodically, MIBs that belong to each port are brought into the IMS MIB engine to be updated. A round-robin schedule by port can be used with repetition every 45 msces. MIB object counts for each port can be transferred from the external memory to the MIB engine for updating as often as every msec. The number of bits kept on-chip for each MIB may be determined according to the worst case situations that can occur within this period.

An advantage of the present invention is that information of statistical interest, i.e., MIB objects, can be accumulated and counted for storage in the external memory through the use of MAC generated MIB reports that contain the necessary information in compressed form. The MIB engine 5 decodes the MIB report data into MIB objects to be accumulated temporarily on-chip and later to be used for updating the external memory. Examples of MIB objects that may be of statistical interest are the following: The number of times a receive packet was dropped due to lack of resources in an IMS port, e.g., receive FIFO overflow. The number of bytes received by a port. The number of valid packets received by a port that are addressed to a broadcast address. The number of valid packets received by a port that are addressed to a multicast address. The number of valid packets received by a port that are not addressed to a multicast address or a broadcast address. The number of valid packets received by a port that are less than 64 bytes long and do not have any error. The number of valid packets received by a port that are less than 64 bytes long and do have an error. The number of received valid packets that are (greater than a set maximum length value typically 1518 packets, without error. The number of received valid packets that are greater than a set value with error. The number of times a packet was not transmitted due to lack of resources in an IMS port, e.g., transmit FIFO underrun. The number of bytes transmitted from a port. The number of packets transmitted from a port (with or without errors). The number of valid packets transmitted from a port that are addressed to a multicast address, or to a broadcast address. The number of collisions that occur on a port during transmission attempts. These examples are typical considerations at present and do not comprise an exhaustive catalog. A preferred data structure for the on-chip RAM storage of the MIB objects is exemplified by FIG. 4. The external memory may be similarly structured with a larger capacity sufficient to hold full updated values.

MIB report structures for transmission (xmt) packets and reception (rcv) packets, which are comprised of fewer fields than the number of different stored MIB objects, are exemplified in the following tables.

Example of transmit report structure:

| Bits | Parameters |
| --- | --- |
| 0 | xmt/rcv |
| 5:1 | port # |
| 16:6 | number of octets transmitted |
| 18:17 | unicast 00; multicast 01; broadcast 10 |
| 19 | pause control packet (100 Mb/s) |
| 20 | tagged packet on a tagged port |
| 21 | underrun |
| 26:22 | number of collisions |
| 27 | late collision |
| 28 | deferred transmit |

Example of receive report structure:

| Bits | Parameters |
| --- | --- |
| 0 | xmt/rcv |
| 5:1 | port number |
| 16:6 | octets received |
| 18:17 | unicast 00; multicast 01; broadcast 10 |
| 19 | pause control packet (100 Mb/s port) |

-continued

| Bits | Parameters |
| --- | --- |
| 20 | tagged packet on a tagged port |
| 21 | alignment error |
| 22 | FCS error |
| 23 | RESERVED |
| 24 | RESERVED |
| 25 | excessive size |
| 26 | receive FIFO overflow |

Several different kinds of errors are represented by bit locations 19, et sec. Processing and expansion of the MIB report information for updating the MIB objects are performed by the MIB engine 92.

Figure 5:
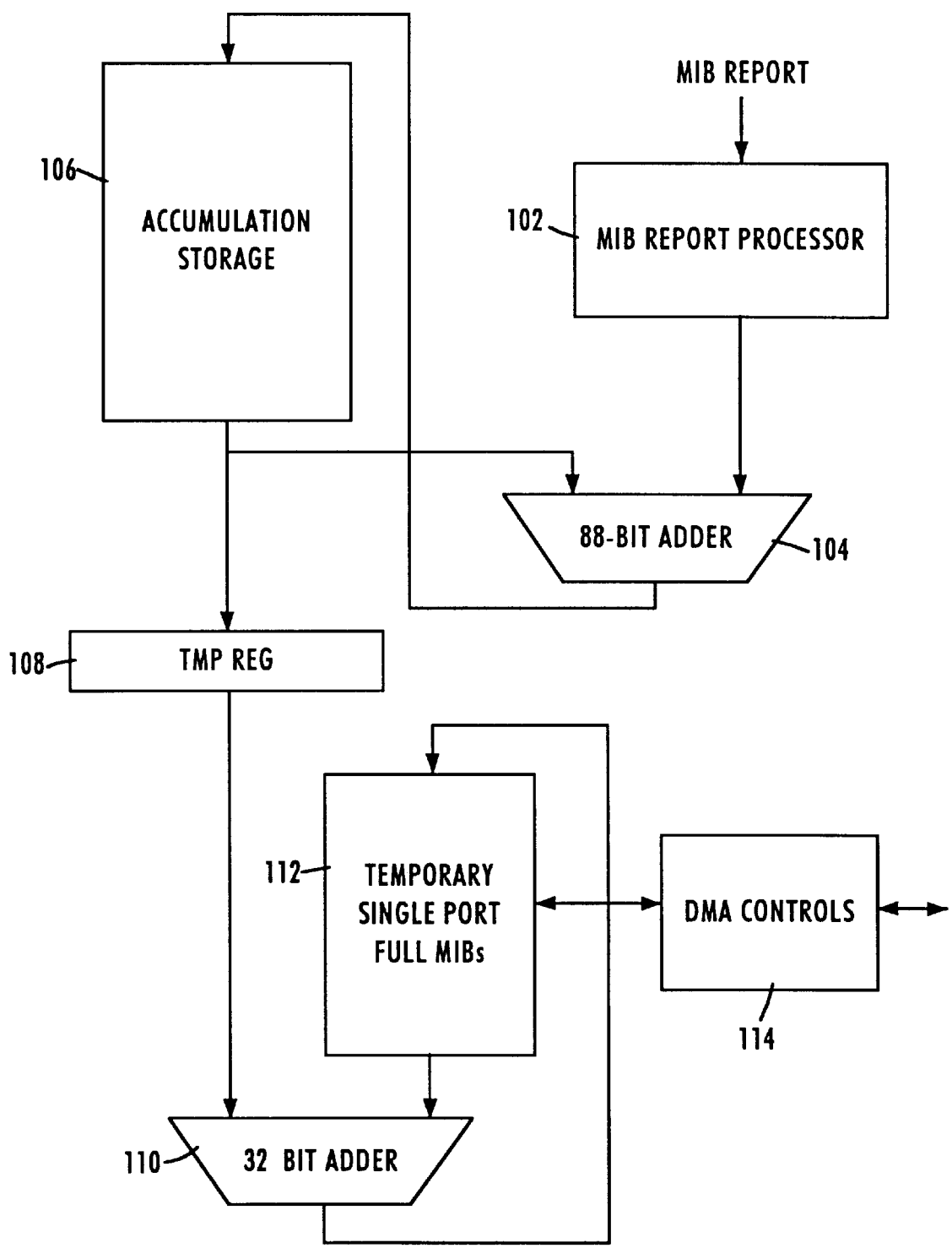
FIG. 5 is a block diagram of the MIB engine 92, shown in FIG. 3.

FIG. 5 is a block diagram of the MIB engine 92, shown in FIG. 3. MIB report processor 102 has an input for receiving MIB reports from the MIB report interface. The output of the MIB report processor is connected to 88-bit adder 104. The 88-bit adder has a second input connected to accumulation storage 106. Accumulation storage 106 may comprise registers, such as flip-flop counters that can contain 16.2 μsecs worth of events. The output of 88-bit adder is connected to the input of accumulation storage 106. Temporary register 108 is configured to received output from accumulation storage 106 and to feed a first input of 32 bit adder 110. A second input to the 32 bit adder is configured to receive input fiom full MIBs temporary single port store 112. Store 112, which may comprise RAM memory, serves as a buffer mailbox for full length MIBs to be transferred to, or received from, the external memory. Inputs to the 32 bit adder are received from the output of the 32 bit adder and the external memory via DMA control 114.

In operation, a MIB report is received in the MIB engine by the MIB report processor 102. The MIB report processor expands the MIB report into the various MIB objects that make up the MIB set, basically by decoding the bits into internal registers. While some of the fields of the MIB report, as exemplified by the tables above set forth, may be common to the fields of the MIB object structure illustrated in FIG. 4. information from the remaining MIB report packet must be processed for allocation to the stored structure. The following instances serve as examples. The MIB object denoted "RcvUndersize Pkts" in FIG. 4 is derived from the "octets" field and the alignment and field of the MIB rcv report table. The processor determines that the object is to be incremented if the reported received octets are less than 64 and does not contain an alignmiient or FCS error. The "ReceiveOversizePackets" object is determined to exist if the number of received packets is greater than a maximum length but does not contain an alignment of FCS error. A jabber is indicative of an extremely long stream of data far in excess of maximum packet length. Determination of the "RcvGoodOctets" object is made if the received octets is between 64 and the maximum length and no errors are indicated. Processing of the MIB report for determining the remaining MIB objects occurs in similar fashion, applying the appropriate conditions and relationships among the received report data.

An appropriate row from accumulation storage 106, for the MAC port that corresponds to the received MIB report is applied to 88-bit addes 104. The processed MIB report data is added to the data retrieved from the accumulation storage and the contents are then written back thereto. While this process is represented in the drawing figure by single lines, a number of MIB additions preferably can be performed in parallel for the particular MIB fields to be updated. The adder can be internally structured to include several adders in parallel to total 88 bit addition. Parallel processing in this manner can accommodate the fast rate at which MIB reports from the plurality of MAC ports are received.

While the capacity of the accumulation storage is limited to conserve chip space, sufficient storage is provided to process several MIB reports. The number of bits kept on-chip for each MIB is determined according to the worst case situations that can occur within the 45 msec MIB report period. Updating can occur as frequently as every 1 msec. As an example of the internal structure of the accumulation storage, four 88 bit rows can be allocated for the data of each port. The length of each segment that accommodates a MIB field may vary in relation to MIB size. The parallel processing of the 88 bit adder thus can direct the MIBs of the row retrieved from accumulation storage to each of the parallel adders within the 88 bit adder.

The external memory is accessed through DMA controller 114. Each time the full-length MIBs of one port are ready to be updated inside the chip, the portion that maps to this particular port is accessed from the external memory and temporarily loaded to single port store 112. This data is read line by line into 32 bit adder 110 to which the accumulated new MIB report data, input from temporary register 108, is added. This addition is applied to one or more MIBs at a time that can be accommodated by the 32 bit width of the adder. The updated values are written back in the temporary single port store before being transferred back to external memory. The contents of the accumulation storage portion allocated to the updated port information is emptied upon updating. The updating process occurs for each port in turn and repeated continually to ensure that the accumulation storage does not overflow.

Various tests may be performed to check the operation of the major MIB interfaces. Under control of the external host 40, a MIB reset instruction can be loaded through the PCI interface to register 96, contained in the PCI control/status registers block 74, illustrated in FIG. 2. Application thereafter to MIB engine 92 will clear the internal storage in the MIB engine. Basic tests can then be undertaken, for example, for checking the timings of the control bus, for checking proper operation of the PCI interface, and for checking MIB updating operations. More advanced tests involve introducing multiple MIB reports as fast as possible in back to back fashion and checking for errors in the results read out. These MIB reports may be introduced either by a port or from an external source. Further tests can be performed under varying conditions.

The present invention thus advantageously provides a multiport switch from which an increased quantity of MIB information may be obtained in fast and efficient manner. A minimum of on-chip space is provided for temporary MIB storage and interaction with external memory for continual updating. MIB reporting is performed by compressing information into a packet at the site of the port and immediately transferred for decompression and accumulation.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. In a data network switch having a logic chip containing a plurality of ports for transmitting data frames to and receiving data frames from a data network, said network being coupled to a plurality of remote stations, a method for acquiring management information base (MIB) data related to a plurality of predefined operational parameters, comprising the steps of:

determining at each of said ports, for each traversing data frame, if a condition for each of said parameters is met;

generating at said port a MIB report in compressed form containing results of said determining step; and temporarily accumulating data contained in said MIB report in uncompressed form at a storage location on said chip.

2. A method as recited in claim 1, wherein at least one of said parameters is related to a transmission event of said frame at the respective port.

3. A method as recited in claim 1, wherein at least one of said parameters is related to a reception event of said frame at the respective port.

4. A method as recited in claim 1, wherein said step of generating comprises:

forming a data packet having fields respectively allocated to each of said parameters for identifying the results of said determining step.

5. A method as recited in claim 4, wherein said accumulating step comprises:

transporting, upon each generation of said data packet in said forming step, the data packet formed in said forming step to said storage location;

decompressing each data packet received at said storage location; and allocating data resulting from said decompressing step to respective fields of a data structure at said storage location.

6. A method as recited in claim 5, wherein said step of allocating data comprises adding decompressed data to data previously accumulated.

7. A method as recited in claim 6, wherein said temporary accumulation storage is structured to contained defined portions dedicated to each said port and said allocating step further comprises accessing the data from the portion for the port corresponding to the decompressed data.

8. An integrated multiport network switch for interfacing with a data network to permit data transmission among, a plurality of remote stations coupled to said data network, said switch having a logic chip comprising:

a plurality of ports for transmitting data frames to and receiving data frames from said data network;

generating means at each port for generating management information base (MIB) data, in compressed form, related to predefined parameters for each transmission of data and reception of data at the respective port;

processing means centrally located on said chip and coupled to each port for expanding the compressed data generated by said generating means; and accumulation storage means for temporarily accumulating the data expanded by said processing means and coupled to a memory, of a storage capacity greater than said accumulation storage means, external to said chip for transferring accumulated data to said memory.

9. An integrated multiport network switch as recited in claim 8, wherein said accumulation storage means has a data structure comprising:

portions allocated respectively to each port each portion configured to contain fields identifying statistical objects related to said predefined parameters, the same fields being contained in each said portion.

10. An integrated multiport network switch as recited in claim 9, wherein at least one of said fields represents data of a plurality of said parameters logically combined.

11. An integrated multiport network switch as recited in claim 9, wherein said processing means further comprises means for adding the accumulated data to data received from said external memory.

* * * * *